United States Patent [19]
Smith

[11] 3,995,217
[45] Nov. 30, 1976

[54] METHOD AND APPARATUS FOR SUPPRESSING BACKGROUND NOISE IN A DIGITAL TELEPHONE SYSTEM

[75] Inventor: Peter Leslie Smith, Northcote, Australia

[73] Assignee: L. M. Ericsson Pty. Ltd., Australia

[22] Filed: Mar. 21, 1974

[21] Appl. No.: 453,635

[30] Foreign Application Priority Data
  Mar. 21, 1973  Australia............................. 2687/73

[52] U.S. Cl. ............................ 325/38 B; 332/11 D; 179/1 HF
[51] Int. Cl.² ........................................ H03K 13/22
[58] Field of Search........... 325/38 B, 62; 332/11 D; 179/1 HF, 1 P, 175.31 E, 15.55 R

[56] References Cited
UNITED STATES PATENTS

| | | |
|---|---|---|
| 3,500,441 | 3/1970 | Brolin................................ 325/38 B |
| 3,582,784 | 6/1971 | Gaunt, Jr. ......................... 325/38 B |
| 3,609,551 | 9/1971 | Brown................................ 325/38 B |
| 3,699,566 | 10/1972 | Schindler .......................... 325/38 B |
| 3,729,678 | 4/1973 | Glasbergen et al. .............. 325/38 B |
| 3,746,990 | 7/1973 | Le Diberder et al.............. 325/38 B |

OTHER PUBLICATIONS
IBM Technical Disclosure Bulletin, "Digital Companding Device for Delta Modulators" by Choquet et al., vol. 15, No. 7, Dec. 1972.

Primary Examiner—Robert L. Griffin
Assistant Examiner—Jin F. Ng
Attorney, Agent, or Firm—Cushman, Darby & Cushman

[57] ABSTRACT

An apparatus for suppressing background noise in a companded delta modulated telephone system. The apparatus includes a comparator for comparing a signal related to the analogue input signal to an encoder of the system with a reference signal. The comparator provides an output to reduce the rate of occurrence of a succession of bits which cause companding within the encoder when the reference signal exceeds the other signal to the comparator. This is achieved by altering the step size of a feedback signal within the encoder or modifying the output from the encoder by removing or inverting one of the compand bits. The reference signal is higher than a signal generated by background noise and consequently for signals below the reference signal the decoder reconstructs an analogue signal which is lower in level than the input signal. A method for achieving the result is also claimed.

8 Claims, 6 Drawing Figures

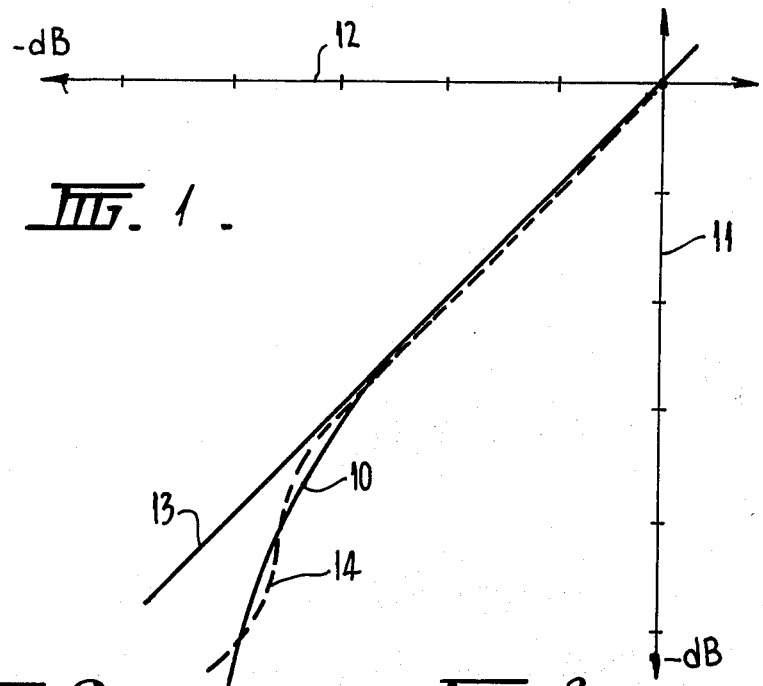
FIG. 1.
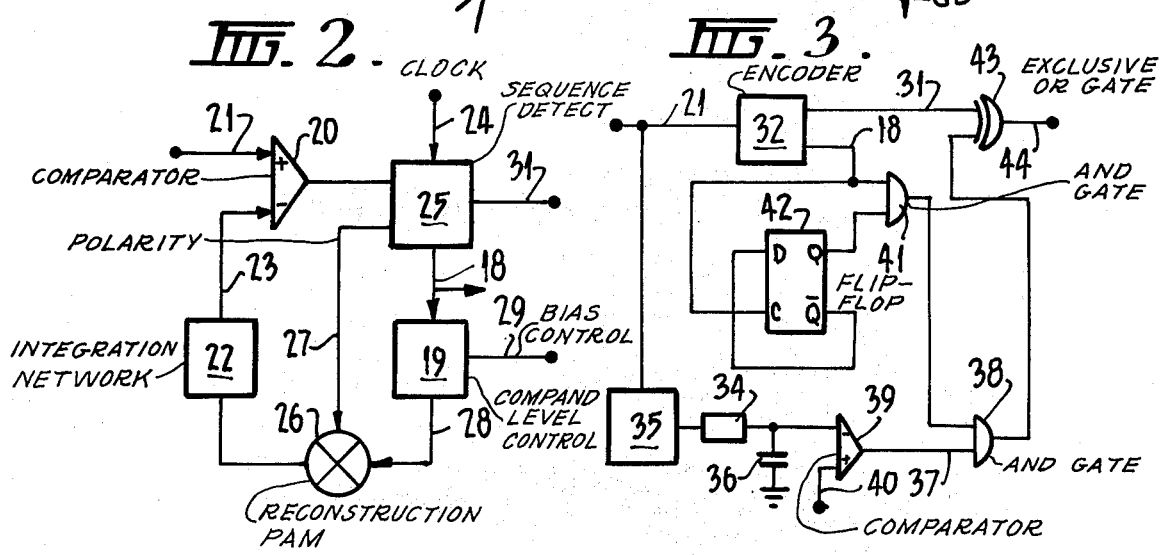

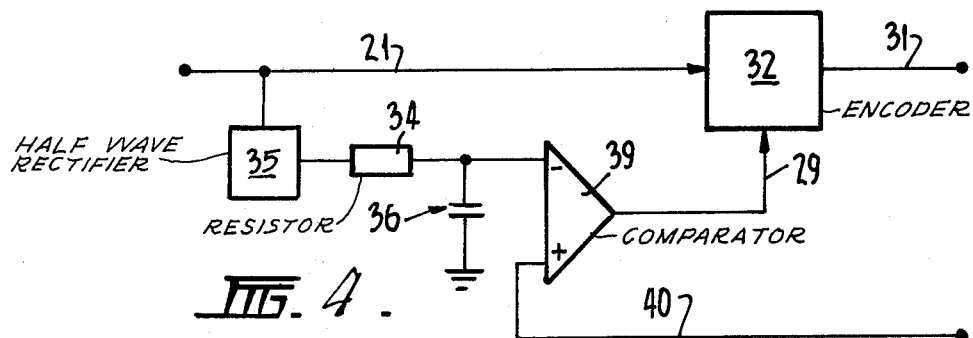
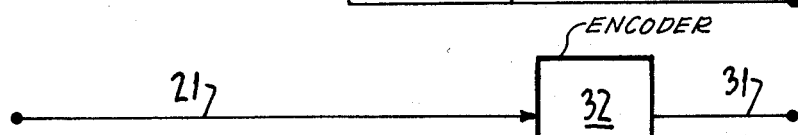
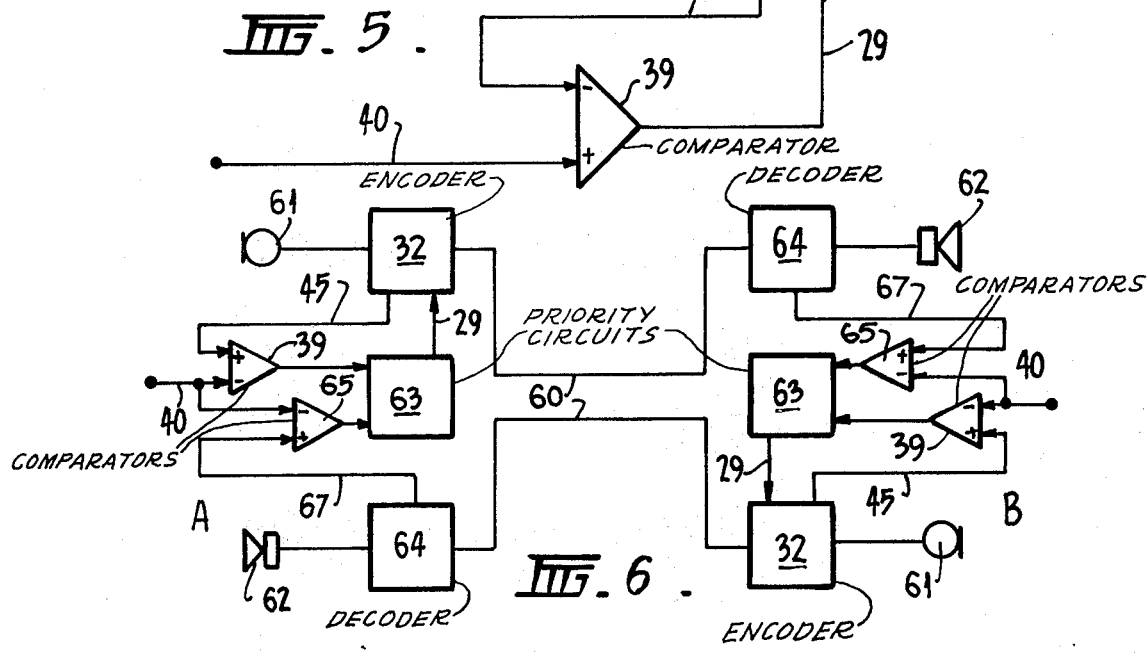

METHOD AND APPARATUS FOR SUPPRESSING BACKGROUND NOISE IN A DIGITAL TELEPHONE SYSTEM

This invention relates to digital speech transmission systems and more particularly to a method and apparatus for compressing transmission in a companded delta modulation speech transmission system such as a telephone system.

A carbon transducer or transmitter for a telephone handset has an output characteristic which has a non-linearity in the region of very low level signals such as background noise. This desirable characteristic causes the very low level signals to be compressed and thus the background noise is attenuated between speech syllables. However, a carbon transmitter has a number of disadvantages in use which make it desirable, in many instances, to use a magnetic transmitter.

A magnetic transducer has a linear characteristic which means that the low signals are not compressed and may therefore be transmitted, causing a decrease in intelligibility. In using a magnetic transmitter it is therefore desirable to have some means for attenuating low level signals and it is the object of this invention to provide such means for a digital telephone system.

The invention has particular utility in loudspeaking telephone systems which must be capable of adequate two-way communication but must not suffer from acoustic feedback.

Accordingly the invention provides a method for compressing transmission in a companded delta modulation speech transmission system, said method including detecting when an analogue input signal to an encoder of the system is below a predetermined level and modifying the digital bit stream output of said encoder on said detection to reduce the rate of occurence of a plurality of successive bits which cause companding within said system such that the analogue output of a decoder of the system is of reduced level with respect to said input.

According to a further aspect the invention provides an apparatus for compressing transmission in a companded delta modulation speech transmission system, said apparatus including means to detect when an alalogue input signal to an encoder of the system is below a predetermined level and further means to modify the digital bit stream output of said encoder on said detection to reduce the rate of occurence of a plurality of successive bits which cause companding within said system such that the analogue output of a decoder of the system is of reduced level with respect to said input.

In order that the invention may be more readily understood particular embodiments will now be described in detail with reference to the accompanying drawings wherein:

FIG. 1 is a graph showing the response of a carbon transmitter, the linear response characteristic of a magnetic transmitter and the response obtained from the present invention, FIG. 2 is a generalised circuit block diagram of a known delta encoder to which the invention may be applied, FIG. 3 is a circuit block diagram of one embodiment of the invention, FIG. 4 is a circuit block diagram of another embodiment of the invention, FIG. 5 is a modified form of the invention shown in FIG. 4 and FIG. 6 shows a further embodiment of the invention and its appliction to a loudspeaking telephone system.

Throughout the drawings like reference numerals designate like or similar integers.

Reference should now be made to FIG. 1 where the graph 10 shows a typical transfer characteristic for a carbon transmitter or transducer. In the figure the axis 12 represents the input sound level to the transducer calibrated in dB and the axis 11 represents the output voltage level calibrated in dB. The low level compression effect is evident from the curve 10. Also, shown in FIG. 1 is the characteristic 13 of a linear transducer such as a magnetic microphone and the approximate compression effect 14 achieved by application of the present invention.

FIG. 2 shows a generalised conventional companded delta encoder to which the invention may be applied to reduce or compress the background noise. The analogue input of the comparator of FIG. 2 is applied to the comparator 20 on connection 21 and is compared with a feedback signal generated in an integration network 22 and fed to the comparator 20 on connection 23. The digital output of the comparator is clocked by a clock signal on 24 into a sequence detect circuit 25. On detection of sequence (consecutive 'ones' or 'zeros') the sequence detect circuit 24 provides a digital output on compand output connection 18 to a compand level control circuit 19. The compand level control circuit 19 contains some form of integration such that the step size of a signal fed to a reconstruction pulse amplitude modulator (PAM) 26 on connection 28 is increased on detection of the sequence and decreased in the absence of said detection. The reconstruction PAM 26 combines the step size amplitude with a polarity control signal on 27 to produce a reconstructed signal which is fed to the integration network 22 on connection 30. A compand bias control 29 alters the weight of the attack and decay of the reconstructed signal, that is, for detection of the sequence the attack rate is increased or decreased depending on the compand bias control setting. The encoder output data appears on connection 31. The generalised delta encoder of FIG. 2 can have either continuous companding or discrete companding wherein the step size is set by fixed resistors or by a discrete pulse width.

Reference should now be made to FIG. 3 which shows an embodiment of the invention wherein a generalised companded delta encoder is represented by the block 32. The analogue input signal appears on connection 21 and is fed to the encoder 32 and to a level detecting circuit comprising half wave rectifier 35, a resistor 34, a capacitor 36 and a comparator 39. The output of the level detecting circuit is supplied on connection 37 to AND gate 38. The level detecting circuit is arranged to provide an output on 37 when the level of the analogue input signal falls below a predetermined level represented by a reference voltage on input 40 to the comparator 39. Output 18 from the encoder 32 is equivalent to the output on connection 18 of FIG. 2. In other words the connection 18 has a signal thereon when a sequence is detected in the encoder. The signal is the compand bits of the encoder. The output 18 in FIG. 3 is supplied to AND gate 41 and to input C of a D-type flip-flop 42. The output Q of the flip-flop 42 is connected to the other input of AND gate 41. The effect of the flip-flop 42 and AND gate 41 is to remove every second compand bit on connection 18. The output of gate 41 is ANDED with the data on connection 37 in AND gate 38 and consequently the AND gate 38 provides an output bit stream when a low level signal is detected, equivalent to the compand bits of the enc oder 32 with every second bit removed. The output of AND gate 38 is connected to exclusive OR gate 43 and the delta modulated data from the encoder 32 is supplied on connection 31 to the other input of the exclusive OR gate 43. The effect of the above described apparatus is that, at any time when a signal having an average value below the reference voltage on 40 is detected, the output bit stream on 31 is modified by exclusive OR gate 43 to invert the last bit in each alternate occurrence of four 'ones' or four 'zeros'. Thus the decoder (not shown) which converts the data on 44 back to an analogue signal receives approximately half the number of compand bits in this compressed mode. Consequently the compand circuitry of the decoder maintains the reconstruction step size at a lower level and the reconstructed analogue signal is a compressed form of the original analogue signal. The reference voltage on 40 is selected to have a value above the level of background noise but less than that of speech signals. The operation of the circuit will introduce some distortion into the reconstructed signal but this is not important as the input signal during these periods of compression is only background noise.

The above embodiment may be modified by cascading any number N of flip-flop 42 to remove N/2 × Z of the compand bits on output 18 where, Z = time rate of occurence of compand bits The embodiment shown in FIG. 4 is less complex than the embodiment of FIG. 3. The level detecting circuitry comprising the rectifier integrator and comparator is the same as for the previous embodiment. However, rather than using the external divider circuitry of the previous embodiment, the output of comparator 39 is connected directly to the compand bias control 29 of the encoder 32. The output of the comparator 39 is interfaced with the bias control such that the bias control is in either of two positions namely, normal or compressed mode. In the compressed mode the bias control weights the compand level control 19 of the encoder to increase the rate of attack of the feedback signal thus causing less compand bits to be generated. Consequently less occurrences of a sequence of four 'ones' or four 'zeros' appear in the outgoing bit stream and therefore the decoder reconstructs a compressed form of the low level signals. The embodiment of FIG. 5 is a further simplified form of the invention whereby the level detector circuitry consists only of the comparator 39. This is achieved with a slight modification to the encoder 32 to bring out a connection 45 which is the compand control voltage of the encoder. The compand control voltage is a voltage generated by the compand level control 19 (FIG. 2) and sent to the PAM 26.

The compand control voltage is approximately proportional to the signal level and when this voltage falls below a predetermined level the compand bias control 29 is modified as in the preceding embodiment.

A modification to the embodiments of FIGS. 4 & 5 is to generate a smooth compression characteristic by progressively varying compand bias control 29. The compand bias control remains constant until the threshold is detected, that is the signal falls below a predetermined level. After detection of the compand bias control 29 is varied linearly (or logarithmically) by suitable circuitry (not shown) to some lower limit. The operation of such a system is considerably smoother than the "off" or "on" type compression of the earlier embodiments. The compression circuits described above may apply to a delta modulation system with continuous or discrete (switched resistor step size setting) companding. For the case of FIG. 3 the detection of signal level is identical and the digital bit stream is altered by some algorithm such that the reconstruction signal step size is reduced at the decoder. For the system of FIG. 4 the companding characteristics within the feedback loop of the encoder are modified so that the bit sequence generated contains information causing the decoder to choose a lower reconstruction step size and hence compression is achieved. Detection of level by the means described in FIG. 5 is easily achieved by monitoring the state (step size in that instant of time), integrating (counting) and controlling the step size setting within the encoder feedback loop. Similarly progressive control may be achieved with a discretely companded delta system.

FIG. 6 shows an embodiment of the invention applied to a loudspeaking telephone system. As mentioned above a loudspeaking telephone must be capable of adequate two-way communication but must not suffer from acoustic feedback, a condition which cannot be met in practice without some form of voice switching (allowing only one direction of conversation to proceed at that instant of time).

The system of FIG. 6 shows a simple two-way loudspeaking telephone connection over two-way line 60. The telephones A & B at respective ends of the line include, additional to the previous described integers, a microphone 61, a loudspeaker 62, a priority circuit 63, a decoder 64 and a comparator 65. The connection 67 from the decoder to the comparator 65 is the decoder compand voltage.

If A and B are not speaking, that is, background noise is being transmitted, then the compression circuits at each end hold the total loop gain well below the gain where acoustic feedback may take place. In other words, the comparators are in the compressed mode and all have outputs in the high state. If A speaks then the link A - B reverts to normal operation and A may speak to B.

If B interjects while A is talking then the priority circuit will cut out B's remark. However B may interject while A is paused between syllables. Thus almost identical techniques are employed in loudspeaking telephones as in low-level compression to follow the characteristics of a carbon transmitter.

I claim:
1. In a delta modulated speech transmission system having an encoder for converting analog input speech signals to a digital bit stream and a decoder for converting said digital bit stream to an output analog speech signal, a method of compressing transmission of said speech signals including the steps of detecting when the amplitude of said analog input speech signal coupled to said encoder is below a predetermined level, and modifying said digital bit stream output of said encoder upon said detection to reduce the rate of occurrence of a plurality of successive bits generated by said encoder, said modifying step companding said speech signal by reducing the rate of occurrence of said plurality of successive bits so that the analog output of said decoder is of reduced level with respect to said analog input signal.

2. A delta modulated speech transmission system comprising an encoder means for converting analog input speech signals to a digital bit stream, a decoder means for converting said digital bit stream to an output analog speech signal, means for detecting when the amplitude of said analog input signal to said encoder is below a predetermined level, and means connected to said encoder and said detecting means for modifying the digital bit stream output of said encoder upon said detection to reduce the rate of occurrence of a plurality of successive bits generated by said encoder, thereby companding said speech signal by reducing said rate of occurrence of said bits so that the analog output of said decoder is of reduced level with respect to said analog input signal.

3. An apparatus as defined in claim 2 wherein said means for detecting when the analog input signal is below said predetermined level includes a comparator means for receiving a signal derived from said analog input signal and a reference signal, said comparator means providing an output to said means for modifying for enabling said means for modifying to selectively invert the last bit of said successive bits when said reference signal exceeds said signal related to said analog input signal.

4. An apparatus as defined in claim 2 wherein said encoder includes a sequence detector, means connected to said sequence detector for generating a compand level control signal, means connected to said sequence detector and said compand level control means for generating a feed-back signal related to said detected sequence, and comparator means for generating said digital bit stream, said comparator means receiving at one input thereof said analog input signal and at the other input thereof the output of said feed-back signal generating means, and wherein said means for detecting when the analog input signal is below a predetermined level generates an output when the output of said compand level control means is less than a reference signal, and further comprising means responsive to said output of said compand level control means for increasing the rate of change of said feed-back signal to thereby reduce the rate of occurrence of said plurality of successive bits, said generated output signal changing the compand bias control of said encoder.

5. The apparatus of claim 4 wherein said means for detecting when the analog input signal is below a predetermined level comprises a comparator.

6. An apparatus as defined in claim 2 wherein said successive bits are similar bits.

7. An apparatus as defined in claim 6 wherein said encoder includes a sequence detector, means connected to said sequence detector for generating a feed-back signal related to said detected sequence, and comparator means for generating said digital bit stream, said analog input signal being coupled to one input of said comparator and the output of said means for generating said feed-back signal being coupled to the other input of said comparator, and wherein said means for detecting when the analog input signal is below a predetermined level further comprises means for increasing the rate of change of said feed-back signal in said encoder to thereby reduce the rate of occurrence of said plurality of successive bits, said means for increasing the rate of change of said feed-back signal controlling the companding of said encoder when said analog input signal is less than a reference signal.

8. The apparatus of claim 7 wherein said means for detecting when the analog input signal is below a predetermined level further comprises a comparator for receiving a signal derived from said analog input signal and said reference signal, said comparator providing an output to control companding when said reference signal exceeds said analog input signal.

* * * * *